United States Patent [19]
Ludwig et al.

[11] Patent Number: 5,659,265
[45] Date of Patent: Aug. 19, 1997

[54] DRIVER CIRCUIT FOR THE GENERATION OF A SWITCHING VOLTAGE

[75] Inventors: Michael Ludwig; Rolf Reber, both of Ulm; Heinz-Peter Feldle, Senden, all of Germany

[73] Assignee: Deutsche Aerospace AG, Munich, Germany

[21] Appl. No.: 326,496

[22] Filed: Oct. 20, 1994

[30] Foreign Application Priority Data

Oct. 20, 1993 [DE] Germany ............... 43 35 684.2

[51] Int. Cl.$^6$ ........................................ G05F 1/10
[52] U.S. Cl. ..................... 327/530; 327/108; 327/513
[58] Field of Search ......................... 327/108, 109, 327/110, 111, 378, 513, 530, 538, 540, 541, 542, 543, 545

[56] References Cited

U.S. PATENT DOCUMENTS 4,897,613  1/1990  Rao et al. ................. 330/253
5,488,328  1/1996  Ludwig et al. ............ 327/513

FOREIGN PATENT DOCUMENTS 291191   4/1988  European Pat. Off. .
2680291  8/1991  European Pat. Off. .

*Primary Examiner*—Timothy P. Callahan
*Assistant Examiner*—Jeffrey Zweizig
*Attorney, Agent, or Firm*—Spencer & Frank

[57] ABSTRACT

A driver circuit for the generation of a switching voltage, particularly a negative switching voltage, which is suitable for GaAs technology. Field effect transistors whose electric properties can vary within a wide range and ohmic resistances that do not have to be adjusted later are used. The driver circuit is particularly suited for the selection of HF components.

15 Claims, 3 Drawing Sheets

DRIVER CIRCUIT FOR THE GENERATION OF A SWITCHING VOLTAGE

REFERENCE TO RELATED APPLICATIONS

This application claims the priority of German application Ser. No. P 43 35 684.2, filed Oct. 20, 1993, which is incorporated herein by reference.

BACKGROUND OF THE INVENTION

The invention is based on a driver circuit for the generation of a switching voltage wherein at least one semiconductor amplifier is present which converts an input signal that is variable within wide limits into an output signal having only two stable initial states.

In many electronics applications, especially in semiconductor circuit engineering, it is necessary to convert, by means of a switching threshold, an input signal present in analog form into an output signal (switching signal) that can be further processed with digital techniques. The output signal depends on the technique selected, e.g., the so-called TTL technique. The corresponding switching points are predetermined for each type of such digital technique. Many driver circuits are based on a semiconductor amplifier with high amplification so that its output signal is only provided with two stable switching states. Such a driver is also called, e.g., a comparator. Such drivers should have switching parameters that are as stable as possible, e.g., a temperature drift of the switching threshold and of the switching states that is as negligible as possible.

Semiconductor components for high and/or extremely high frequency engineering, e.g., the so-called millimeter wavelength technology, are based on the GaAs semiconductor material (GaAs technology). With this material, so-called HEMT (high electron mobility technology) components can be produced. Such HEMT components have a temperature behavior that is stable per se, i.e., a low temperature drift of the electrical properties.

SUMMARY OF THE INVENTION

It is the object of the invention to propose a driver circuit of the generic type that has a low temperature drift and that can be integrated cost-effectively particularly into components produced with GaAs technology.

This object generally is achieved according to the present invention by driver circuit for the generation of a switching voltage by converting an input signal that is variable within wide limits into an output signal having only two stable initial states, which circuit comprises: at least first, second and third field effect transistors produced in the same production process; a source follower circuit for measuring the actual pinch-off voltage ($U_p$) contingent on the production process and characterizing the first, second and third field effect transistors, with the source follower circuit including the first field effect transistor whose drain is connected to one pole of a voltage source, whose source is connected to one end of an ohmic source voltage divider having its other end connected to the other pole of the voltage source, and whose gate is connected to a tap of an ohmic gate voltage divider connected between the poles of the voltage source to produce a reference voltage at this gate. At the drain of this transistor a voltage is available which corresponds to the actual pinch-off voltage of the transistors; the second field effect transistor having its source connected to a tap of the source voltage divider such that a source voltage ($U_{s3}$) that corresponds to the actual pinch-off voltage is created at the source of the second field effect transistors, its drain connected to the one pole of the voltage source via the third field effect transistor, which is connected as a nonlinear resistance, and its gate connected via an ohmic resistance to the other pole of the voltage source and to a signal input; and, the third field effect transistor has its drain connected to the one pole of the voltage source, its source and its gate connected to each other, to the drain of the second field effect transistor, and to signal output. Advantageous developments and/or modifications likewise are disclosed.

A first advantage of the invention is that the output signal is almost independent of the production process of the field effect transistors.

A second advantage is that only a single type of field effect transistor is necessary, e.g., n-channel junction field effect transistors.

A third advantage is that the output signal is almost independent of temperature variations during circuit operation.

A fourth advantage is that, in addition to the field effect transistors, only ohmic resistances are required, which can be produced with integrated technology in a cost-effective manner.

A fifth advantage is that the switching arrangement can be integrated reliably and cost-effectively into integrated circuits produced with GaAs technology.

A sixth advantage is that, even if the basic circuit is expanded by an inverter and/or a level converter, only a single voltage source is required.

Further advantages ensue from the description below wherein the invention is explained in greater detail by way of embodiments with reference to schematically shown figures.

DETAILED DESCRIPTION OF THE PREFERRED EMBODIMENT

In the following, the junction field effect transistor used by way of example is abbreviated by JFET, which abbreviation is commonly known to a person skilled in the art. Moreover, the examples described in the following are based on the use of n-channel JFET's. A person skilled in the art, however, is familiar with constructing a corresponding circuit with any other type self-conducting FET so that the invention also comprises these other types.

Advantageously, the following examples only use ohmic resistances that are fixedly set, even though the JFET's that are generally configured as MESFET's may vary considerably with regard to their basic electrical properties. This is particularly true for GaAs technology. A later adjustment of the resistances is not necessary.

The invention is based on the discovery of measuring a fundamental property characterizing JFET's, namely the actual pinch-off voltage $U_p$, and to derive dependent voltages from the measured property. These dependent voltages are fed to further JFET's and thus their working points and/or working ranges are set. In this manner, production-related tolerances can be compensated for within a wide range, e.g., more than ±20%.

The following examples relate to the generation of an output signal, which, as a function of the level of the input signal, can only assume two switching states, i.e., the switching states 0V (reference potential) and −3.5 V. These circuit voltages are particularly needed for high and/or extremely high frequency circuits, e.g., in millimeter wavelength technology. The latter uses GaAs technology in monolithic or hybrid-integrated form.

The following examples relate to a standard JFET provided with a nominal pinch-off voltage $U_p$=1.2 V and a nominal saturation current $I_{dss}$=1.45 mA. The associated actual values may vary by ±20%, i.e., −1.4 V<$U_p$<−1 V; 1.2 mA<$I_{dss}$<1.7 mA. A negative voltage source SP of −7 V is used as a base.

Figure 1:
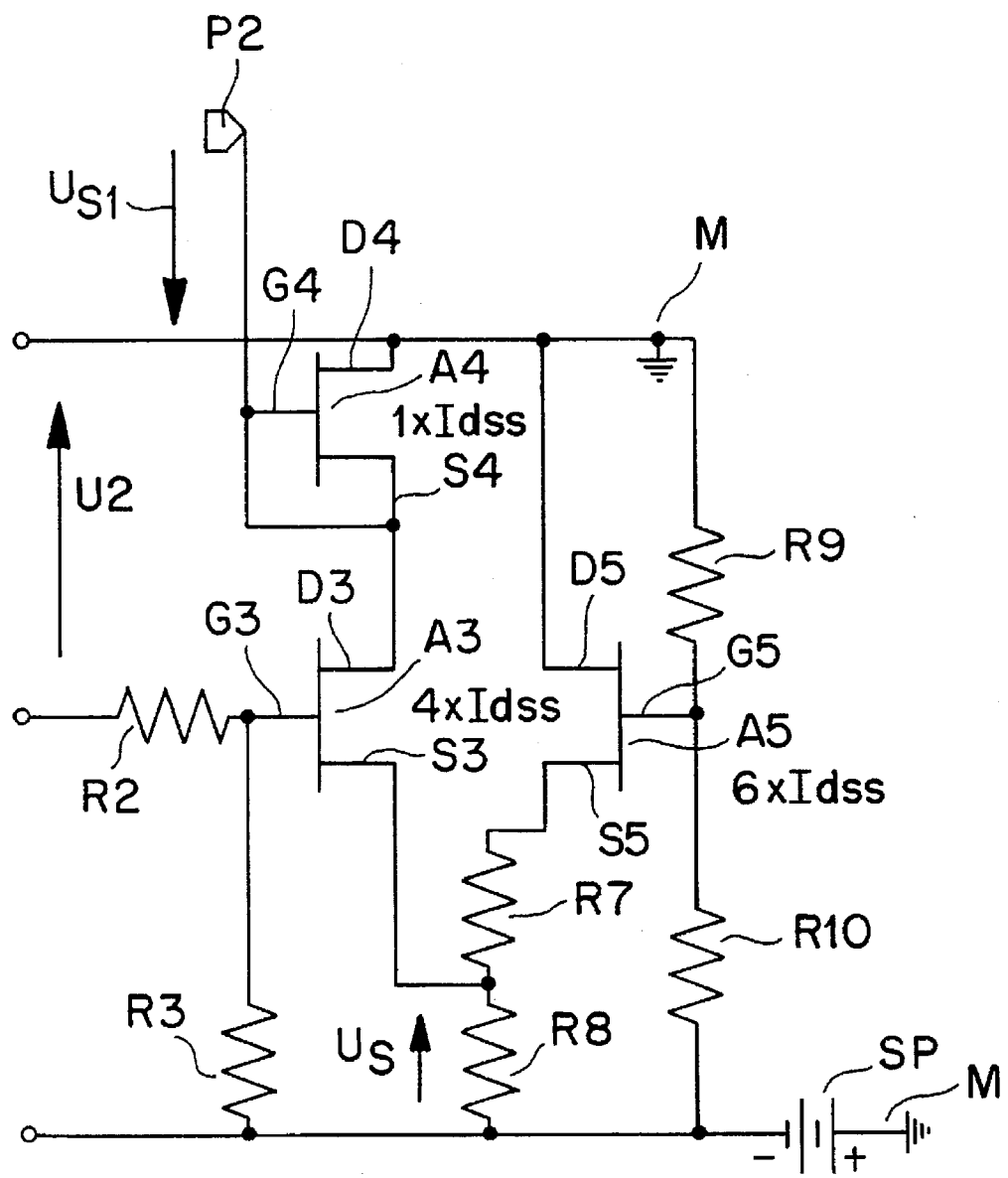
FIG. 1 is a schematic circuit diagram of a first embodiment of the invention.

According to FIG. 1, the measurement of the actual pinch-off voltage is carried out with the JFET A5 which is connected as a source follower and which has a nominally high saturation current, e.g., 6×$I_{dss}$. The associated gate voltage divider R9, R10, e.g., R9=2600 Ω, R10=1400 Ω, is connected between the poles of the source SP and sets a fixed reference voltage at gate G5 of JFET A5. Because of the high saturation current of the transistor A5, a voltage $U_s$ is created across the resistant R8 of the series connection of resistances R7 and R8 connected between the source S5 of JFET A5 and the negative pole of source SP, with the magnitude of this created voltage being approximately that of the differential between the reference voltage and the pinch-off voltage. Since this voltage $U_s$ controls the source electrode S3 of JFET A3 via the voltage divider R7, R8, e.g., R7=50 Ω, and R8=600 Ω, the working point of this transistor A3 is stabilized because it has the same pinch-off voltage as transistor A5.

The actual derivation of an output signal $U_{s1}$, which can be tapped at the connection P2, from the input signal U2, which may, e.g., fluctuate between the values −7 V and 0 V, is carried out with the first JFET A3. In this process, the input signal U2 is applied to gate G3 of JFET A3 via a voltage divider R2, R3, e.g., R2=10 kΩ, R3=30 kΩ. Source S3 of FET A3 is connected to the tap of source voltage divider R7, R8, i.e., the common convertor of resistors A7 and R8, so that a source voltage $U_s$, e.g., $U_s$=−4 V, is applied to source S3. This source voltage $U_s$ is proportional to the actual pinch-off voltage $U_p$ and thus adjusts and stabilizes the working range of the JFET A3. The latter JFET A3 also has a high saturation current, e.g., 4×$I_{dss}$. The output signal $U_{s1}$ can be tapped at connection P2 as well as at drain D3 of FET A3 associated with it. A JFET A4 is connected between drain D3 and ground M constituted by a pole of the voltage source SP, i.e., the positive pole as shown, with JFET A4 having the standard saturation current 1×$I_{dss}$ and having its drain D4 applied to ground M and its gate G4 connected to its source S4 and to drain D3 of JFET A3.

Figure 2:
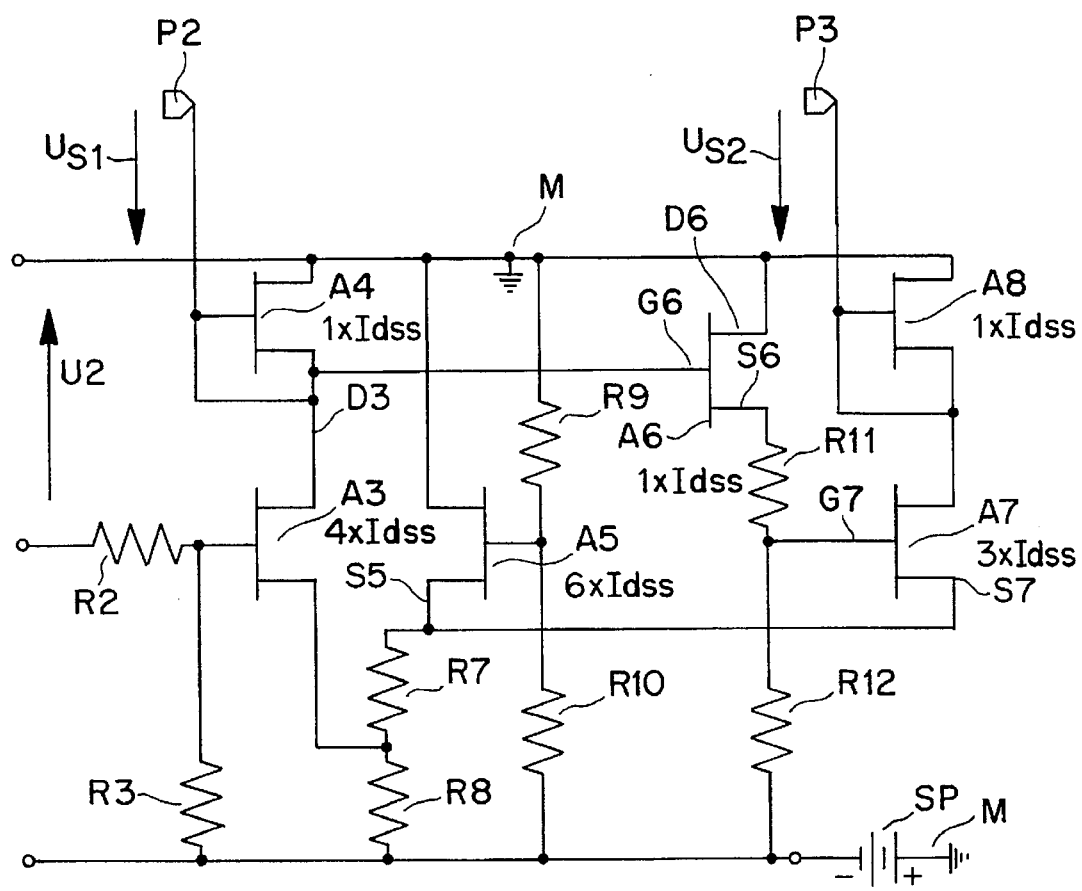
FIG. 2 is a schematic circuit diagram of a modification of the embodiment of FIG. 1 in which an inverter circuit for the output signal is additionally provided.

The embodiment according to FIG. 2 only differs from the one described above in FIG. 1 in that, in addition, an inverter stage is present, which consists of JFET's A6 to A8 and the resistances R11, R12. With the invertor an output signal $U_{s2}$, which is inverse to output signal $U_{s1}$ present at output P2 is provided at output P3.

The inverter stage contains a source follower circuit consisting of JFET A6 whose gate G6 is connected to the drain D3 of JFET A3, whose drain D6 is connected to ground M, and whose source S6 is connected to the other pole (−) of voltage source SP via a voltage divider R11, R12, e.g., R11=3 kΩ, R12=2.2 kΩ. JFET A6 is designed for the standard saturation current (1×$I_{dss}$). The circuit arrangement of JFET A7, having a saturation current of 3×$I_{dss}$, and of JFET A8, having the standard saturation current 1×$I_{dss}$, corresponds to that of JFET A3, A4. Here, the inversion of the output signal $U_{s1}$ takes place in JFET A7, whose gate G7 is connected the top of to voltage divider R11, R12, and whose source S7 is connected to the source S5 of JFET A5. Thus it is accomplished that the actual pinch-off voltage measured by JFET A5 also sets the inverter stage A6 to A8 with regard to the working range in an optimum manner.

Figure 3:
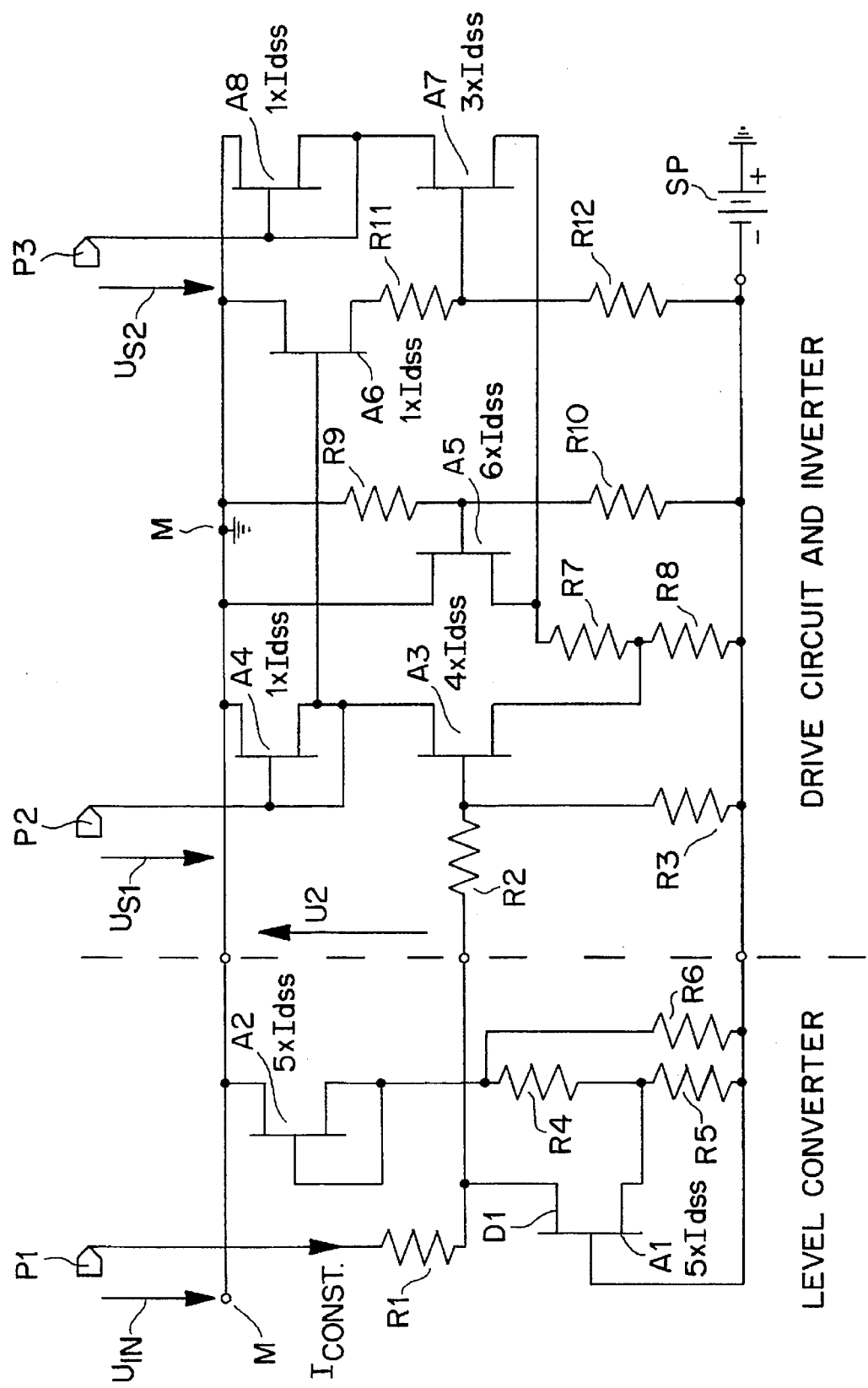
FIG. 3 is a schematic circuit diagram of a modification of the embodiment of FIG. 2 in which a level converter for the input signal is additionally provided.

The embodiment according to FIG. 3 differs from that of FIG. 2 in that an additional level converter is provided. This makes it possible to convert an input signal $U_{in}$, which is arbitrary within wide margins and which is applied between connection P1 and ground M, into the negative switching output signals $U_{s1}$ at output P2 or $U_{s2}$ at output P3. In this process, the input signal $U_{in}$ may fluctuate, e.g., between the voltages +5 V and 0 V, so that, e.g., the so-called TTL signals which fluctuate between +2.4 V and 0.7 V, can be converted.

The level converter contains, as the essential circuit element, a constant-current source which is described in more detail in our concurrently filed commonly assigned U.S. patent application Ser. No. 08/326,497, U.S. Pat. No. 5,488,328, which corresponds to German patent application P 43 35 683.4 filed Oct. 20, 1993, and which is incorporated herein by reference. The constant-current source consists of the JFET's A1, A2 (which are substantially identical transistors and preferably have saturation currents substantially larger than $I_{const}$, e.g., 5×$I_{dss}$) and of the ohmic resistances R4 to R6, with the constant current $I_{const}$ essentially flowing through drain D1 of JFET A1. This constant current $I_{const}$, e.g., $I_{const}$=1 mA, also flows through input resistance R1, e.g., R1=7.7 kΩ, connected between drain D1 and the (input) connection P1. Drain D1 additionally is connected to the input, i.e., resistor R2, of the driver circuit. The (driver) input voltage U2 applied there follows from Ohm's law pursuant to the formula:

$$U2 = U_{in} - R1 \cdot I_{const}.$$

If $U_{in}$ now is a positive voltage and if, in addition, the formula applies:

$$R1 \cdot I_{const} > \hat{U}_{in}$$

with $\hat{U}_{in}$ being the maximum admissible positive input voltage, then the (driver) input voltage U2 is always a negative voltage, which preferably is within a range of −3.5 V to −5.5 V. The latter voltage valve is shifted further into the negative voltage range via the mentioned (input) voltage divider R2, R3, e.g., R2=10 kΩ, R3=30 kΩ, while an amplitude attenuation is taking place at the same time, and the driver input voltage U2 is further processed in the manner described.

If all JFET's according to FIG. 3, with the saturation currents mentioned, are now produced in the same production process, the following particularly advantageous properties ensue:
- the circuit only requires a single negative operating voltage (SP), of, e.g., −7 V;
- a large degree of independence of production-related process variances, e.g., ±20%;
- if so-called HEMT processes are used for the production of the circuit, an almost constant temperature behavior of the electric properties described ensues within wide limits;

if such a circuit is arranged on the HF circuit components mentioned, e.g., on so-called MMIC chips ( millimeter wavelength IC), the number of otherwise necessary driver lines for the high frequency (HF) components, e.g., switches, phase shifters as well as amplifiers with digital amplification setting, can be greatly reduced, e.g., by a factor of 2; and interconnecting lines and their associated interconnecting connectors that are otherwise necessary, e.g., so-called bond connections and bond passes, are eliminated.

The invention is not limited to the embodiments described but can be analogically applied to further embodiments.

The invention now being fully described, it will be apparent to one of ordinary skill in the art that any changes and modifications can be made thereto without departing from the spirit or scope of the invention as set forth herein.

What is claimed:

1. Driver circuit for the generation of a switching voltage by converting an input signal that is variable within wide limits into an output signal having only two stable initial states, said circuit comprising:

at least first, second and third field effect transistors produced in the same production process;

a source follower circuit for measuring the actual pinch-off voltage ($U_p$) contingent on the production process and characterizing said first, second and third field effect transistors, said source follower circuit including said first field effect transistor whose drain is connected to one pole of a voltage source, whose source is connected to one end of an ohmic source voltage divider having its other end connected to the other pole of the voltage source, and whose gate is connected to a tap of an ohmic gate voltage divider connected between said one and said other poles of said voltage source to produce a voltage at said gate corresponding to the nominal pinch-off voltage of said transistors;

the second field effect transistor having its source connected to a tap of said source voltage divider such that a source voltage ($U_{s3}$) that corresponds to the actual pinch-off voltage is created at said source of said second field effect transistors, its drain connected to said one pole of said voltage source via said third field effect transistor which is connected as a nonlinear resistance, and its gate is connected via an ohmic resistance to said other pole of said voltage source, and to a signal input; and said third field effect transistor has its drain connected to said one pole of said voltage source, its source and its gate connected to each other, to said drain of said second field effect transistor, and to a signal output.

2. The driver circuit according to claim 1, wherein the saturation currents ($I_{dss}$) of said first and second field effect transistors are considerably larger than the saturation current of said third field effect transistor.

3. The driver circuit according to claim 2, wherein said signal output is a non-inverting signal output; and further comprising: an inverter stage having a signal input connected to said non-inverting signal output and an inverting signal output for providing an output signal which is inverted with respect to the output signal at said non-inverting output.

4. The driver circuit according to claim 3, wherein said inverter stage is connected to said one end of said source voltage divider and is controlled in accordance with the pinch-off voltage ($U_p$) present there.

5. The driver circuit according to claim 4, wherein said gate of said second field effect transistor is connected to said signal input via a further resistance; and further comprising a level converter connected between said further resistance and said signal input, with said level converter containing a constant-current source.

6. The driver circuit according to claim 5, wherein said driver circuit includes only a single voltage source constituted by said voltage source.

7. The driver circuit according claim 5, wherein: each of said inverter and said level convertor includes at least one field effect transistor; and all of said field effect transistors are produced during the same production process.

8. The driver circuit according to claim 7, wherein said field effect transistors are junction field effect transistors.

9. The driver circuit according to claim 8 wherein said field effect transistors are n-channel transistors and said other pole of said voltage source is a negative pole.

10. The driver circuit according to claim 9 wherein said one pole of said voltage source is connected to ground.

11. The driver circuit according to claim 1 wherein said field effect transistors are n-channel transistors and said other pole of said voltage source is a negative pole.

12. The driver circuit according to claim 1, wherein said signal output is a non-inverting signal output; and further comprising: an inverter stage having a signal input connected to said non-inverting signal output and an inverting signal output for providing an output signal which is inverted with respect to the output signal at said non-inverting output.

13. The driver circuit according to claim 12, wherein said inverter stage is connected to said one end of said source voltage divider and is controlled in accordance with the pinch-off voltage ($U_p$) present there.

14. The driver circuit according to claim 13, wherein said gate of said second field effect transistor is connected to said signal input via a further resistance; and further comprising a level converter connected between said further resistance and said signal input, with said level converter containing a constant-current source.

15. The driver circuit according to claim 1, wherein said gate of said second field effect transistor is connected to said signal input via a further resistance; and further comprising a level converter connected between said further resistance and said signal input, with said level converter containing a constant-current source.

* * * * *